(12) United States Patent
Ayoub et al.

(10) Patent No.: US 10,347,465 B2
(45) Date of Patent: Jul. 9, 2019

(54) APPARATUS AND METHOD FOR TUNING A PLASMA PROFILE USING A TUNING ELECTRODE IN A PROCESSING CHAMBER

(71) Applicant: Applied Materials, Inc., Santa Clara, CA (US)

(72) Inventors: Mohamad A. Ayoub, Los Gatos, CA (US); Jian J. Chen, Fremont, CA (US); Amit K. Bansal, Milpitas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/862,851

(22) Filed: Jan. 5, 2018

(65) Prior Publication Data

US 2018/0130637 A1   May 10, 2018

Related U.S. Application Data

(62) Division of application No. 14/771,169, filed as application No. PCT/US2014/016098 on Feb. 12, 2014, now Pat. No. 9,865,431.

(Continued)

(51) Int. Cl.
*H05H 1/46* (2006.01)
*H01J 37/32* (2006.01)
(Continued)

(52) U.S. Cl.
CPC ...... *H01J 37/32174* (2013.01); *C23C 16/505* (2013.01); *C23C 16/509* (2013.01);
(Continued)

(58) Field of Classification Search
CPC ................ C23C 16/505; C23C 16/509; H01J 37/32091; H01J 37/32183;
(Continued)

(56) References Cited

U.S. PATENT DOCUMENTS 4,464,223 A   8/1984   Gorin
5,605,576 A   2/1997   Sasaki et al.
(Continued)

FOREIGN PATENT DOCUMENTS

EP   2500965 A2   9/2012
JP   2004193567 A   7/2004
JP   2009-004289 A   1/2009

OTHER PUBLICATIONS

International Search Report and Written Opinion, PCT/US2014/016098, dated Jun. 9, 2014.
(Continued)

*Primary Examiner* — Marianne L Padgett
(74) *Attorney, Agent, or Firm* — Patterson + Sheridan LLP

(57) ABSTRACT

Embodiments of the present invention relate to apparatus for enhancing deposition rate and improving a plasma profile during plasma processing of a substrate. According to embodiments, the apparatus includes a tuning electrode disposed in a substrate support pedestal and electrically coupled to a variable capacitor. The capacitance is controlled to control the RF and resulting plasma coupling to the tuning electrode. The plasma profile and the resulting deposition rate and deposited film thickness across the substrate are correspondingly controlled by adjusting the capacitance and impedance at the tuning electrode.

14 Claims, 4 Drawing Sheets

Related U.S. Application Data

(60) Provisional application No. 61/792,707, filed on Mar. 15, 2013.

(51) Int. Cl.
*C23C 16/509* (2006.01)
*C23C 16/505* (2006.01)

(52) U.S. Cl.
CPC .... *H01J 37/3244* (2013.01); *H01J 37/32091* (2013.01); *H01J 37/32183* (2013.01); *H01J 37/32715* (2013.01); *H01J 37/32935* (2013.01); *H01J 2237/3321* (2013.01)

(58) Field of Classification Search
CPC ............. H01J 37/32174; H01J 37/3244; H01J 37/32715; H01J 37/32935; H01J 2237/3321; H01L 21/6831; H01L 21/6833
USPC .................................................. 427/569–579
See application file for complete search history.

(56) References Cited

U.S. PATENT DOCUMENTS

| | | | |
|---|---|---|---|
| 6,270,618 B1 | 8/2001 | Nakano et al. | |
| 6,706,138 B2 | 3/2004 | Barnes et al. | |
| 7,004,107 B1 | 2/2006 | Raoux et al. | |
| 7,781,098 B2 | 8/2010 | Chiang et al. | |
| 7,939,584 B2 | 5/2011 | Harris et al. | |
| 8,168,326 B2 | 5/2012 | Chiang et al. | |
| 8,734,664 B2* | 5/2014 | Yang | H01J 37/32082 216/67 |
| 9,017,533 B2* | 4/2015 | Forster | H01J 37/32091 204/298.06 |
| 9,210,790 B2* | 12/2015 | Hoffman | H05H 1/46 |
| 9,337,072 B2* | 5/2016 | Balasubramanian | C23C 16/52 |
| 9,490,116 B2* | 11/2016 | Tsiang | H01L 21/0217 |
| 10,032,608 B2* | 7/2018 | Chen | H01J 37/32183 |
| 10,125,422 B2* | 11/2018 | Chen | C23C 16/46 |
| 2002/0186018 A1 | 12/2002 | Sill et al. | |
| 2007/0006972 A1 | 1/2007 | Piptone et al. | |
| 2007/0023398 A1 | 2/2007 | Kobayashi et al. | |
| 2008/0084650 A1* | 4/2008 | Balasubramanian | C23C 16/52 361/234 |
| 2008/0180357 A1 | 7/2008 | Kawakami et al. | |
| 2009/0229969 A1 | 9/2009 | Hoffman et al. | |
| 2009/0230089 A1 | 9/2009 | Bera et al. | |
| 2009/0236214 A1 | 9/2009 | Janakiraman et al. | |
| 2010/0012029 A1* | 1/2010 | Forster | H01J 37/32091 118/708 |
| 2010/0013572 A1* | 1/2010 | Shannon | H03H 7/38 333/124 |
| 2010/0018648 A1 | 1/2010 | Collins et al. | |
| 2010/0213047 A1 | 8/2010 | Nagamine et al. | |
| 2010/0252417 A1 | 10/2010 | Allen et al. | |
| 2011/0123866 A1 | 5/2011 | Pan et al. | |
| 2011/0143018 A1 | 6/2011 | Peng et al. | |
| 2011/0168550 A1 | 7/2011 | Wang et al. | |
| 2012/0202113 A1 | 8/2012 | Hodge et al. | |
| 2012/0219841 A1 | 8/2012 | Bolandi et al. | |
| 2013/0017340 A1 | 1/2013 | Brown et al. | |
| 2013/0288483 A1 | 10/2013 | Sadjadi et al. | |
| 2014/0302256 A1* | 10/2014 | Chen | C23C 16/46 427/569 |
| 2016/0013022 A1 | 1/2016 | Ayoub et al. | |
| 2016/0017494 A1* | 1/2016 | Ayoub | H01J 37/32091 427/569 |
| 2017/0069464 A1* | 3/2017 | Ye | H01L 21/67103 |
| 2017/0365450 A1* | 12/2017 | Bi | H01J 37/32862 |
| 2018/0308669 A1* | 10/2018 | Bokka | H01L 21/67103 |

OTHER PUBLICATIONS

International Search Report and Written Opinion, PCT/US204/020788, dated Jun. 23, 2014.

* cited by examiner

APPARATUS AND METHOD FOR TUNING A PLASMA PROFILE USING A TUNING ELECTRODE IN A PROCESSING CHAMBER

CROSS-REFERENCE TO RELATED APPLICATIONS

This application is a divisional application of U.S. patent application Ser. No. 14/771,169, filed on Feb. 12, 2014, which claims benefit of U.S. Provisional Patent Application Ser. No. 61/792,707, filed on Mar. 15, 2013. Each of the aforementioned patent applications is herein incorporated by reference.

BACKGROUND OF THE INVENTION

Field of the Invention

Embodiments of the present invention generally relate to an apparatus and method for processing substrates. More particularly, embodiments of the present invention relate to a plasma processing chamber with a tuning electrode disposed in a substrate support pedestal for enhanced processing rate and improved center to edge plasma profile uniformity.

Description of the Related Art

Plasma processing, such as plasma enhanced chemical vapor deposition (PECVD), is used to deposit materials, such as blanket dielectric films on substrates, such as semiconductor wafers. A challenge for current plasma processing chambers and processes includes controlling critical dimension uniformity during plasma deposition processes. A particular challenge includes substrate center to edge thickness uniformity in films deposited using current plasma processing chambers and techniques.

Accordingly, it is desirable to develop an apparatus and process for enhancing deposition rate and improving the center to edge thickness uniformity of films deposited during plasma processing.

SUMMARY OF THE INVENTION

In one embodiment of the present invention, a method for processing a substrate comprises powering a gas distribution manifold using an RF source while flowing one or more process gases into a plasma chamber to form a plasma within a process volume of the chamber and controlling the plasma by varying a capacitance of a tuning electrode disposed within a substrate support pedestal within a chamber body of the chamber.

In another embodiment, a method for processing a substrate comprises powering a gas distribution manifold using an RF source while flowing one or more process gases into a plasma chamber to form a plasma within a process volume of the plasma chamber, receiving, from a sensor coupled directly to a tuning electrode, a signal to adjust a capacitance of the tuning electrode, and varying, based on the signal, a capacitance of a variable capacitor coupled directly to the sensor.

In yet another embodiment, a method for processing a substrate comprises receiving, from a sensor, a signal to adjust a capacitance of the tuning electrode, the tuning electrode disposed within a substrate support pedestal and electrically coupled directly to the sensor, and varying, based on the signal, a capacitance of a variable capacitor electrically coupled directly to the sensor.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention relate to apparatus for enhancing deposition rate and improving a plasma profile during plasma processing of a substrate. According to embodiments, the apparatus includes a tuning electrode disposed in a substrate support pedestal and electrically coupled to a variable capacitor. The capacitance is controlled to control the RF and resulting plasma coupling to the tuning electrode. The plasma profile and the resulting deposition film thickness across the substrate are correspondingly controlled by adjusting the capacitance and impedance at the tuning electrode.

Figure 1:
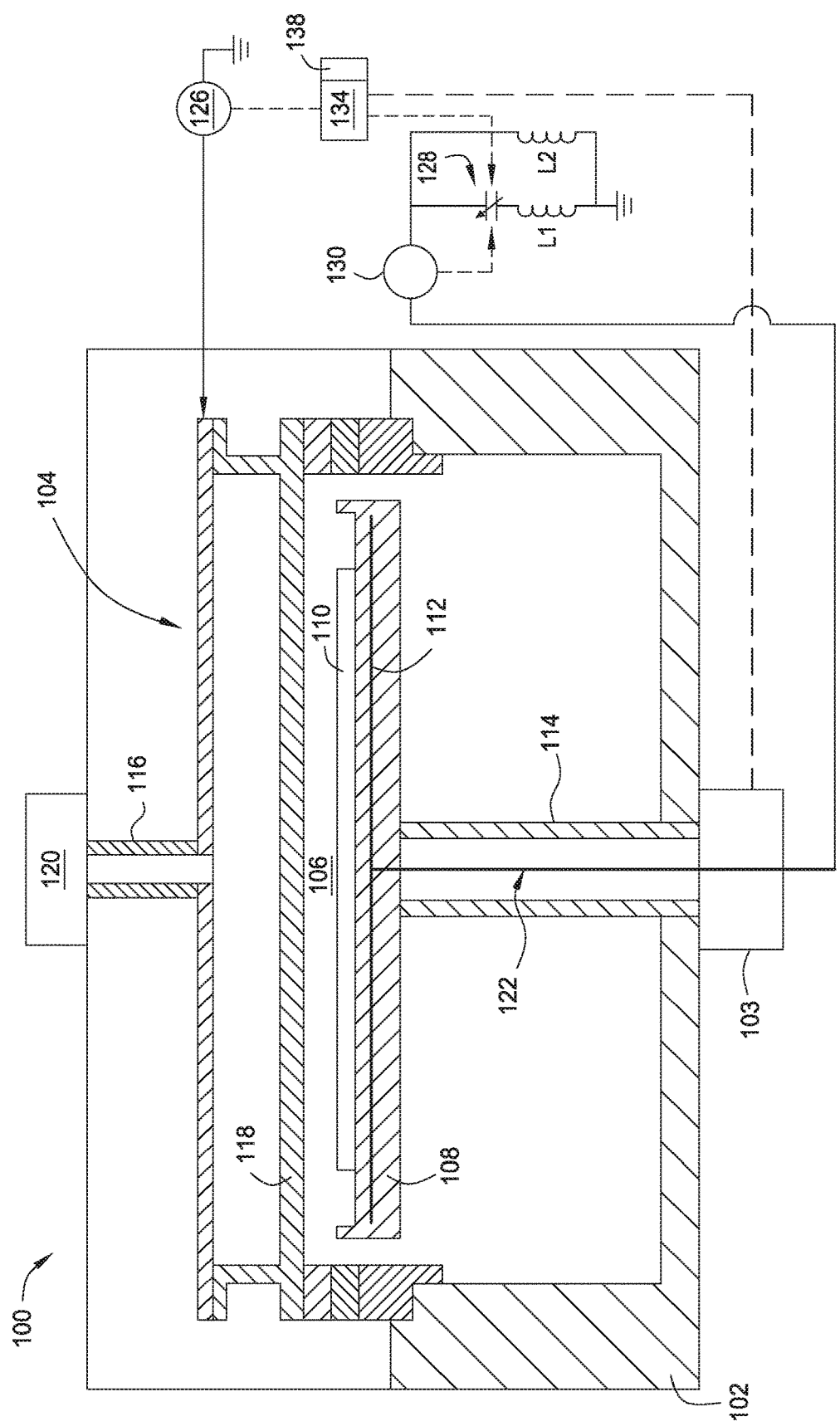
FIG. 1 is a schematic, cross-sectional view of a plasma processing apparatus according to one embodiment of the present invention.

FIG. 1 is a schematic, cross-sectional view of a plasma processing apparatus according to one embodiment of the present invention. The apparatus includes a chamber 100 in which one or more films may be deposited on a substrate 110. The chamber includes a chamber body 102 and a gas distribution assembly 104, which distributes gases uniformly a process volume 106. A pedestal 108 is disposed within the process volume and supports the substrate 110. The pedestal 108 includes a heating element (not shown). The pedestal 108 is movably disposed in the process volume by a stem 114 that extends through the chamber body 102, where it is connected to a drive system 103 for raising, lowering, and/or rotating the pedestal 108.

The gas distribution assembly 104 includes a gas inlet passage 116, which delivers gas from a gas flow controller 120 into a gas distribution manifold 118. The gas distribution manifold 118 includes a plurality of nozzles (not shown) through which gaseous mixtures are injected during processing.

An RF (radio frequency) power source 126 provides electromagnetic energy to power the gas distribution manifold 118, which acts as a powered electrode, to facilitate generation of a plasma between the gas distribution manifold 118 and the pedestal 108. The pedestal 108 includes a tuning electrode 112, which is electrically grounded through an RF rod 122 such that an electric field is generated in the chamber 100 between the powered gas distribution manifold 118 and the tuning electrode 112. In one embodiment, the tuning electrode 112 comprises a conductive mesh, such as an aluminum or molybdenum mesh.

The tuning electrode 112 is electrically coupled to a variable capacitor 128, such as a variable vacuum capacitor, and terminated to ground through an inductor L1. A second inductor L2 is electrically coupled in parallel to the variable capacitor 128 to provide a path for low frequency RF to ground. In addition, a sensor 130, such as a VI sensor, is positioned between the tuning electrode 112 and the variable capacitor 128 for use in controlling the current flow through the tuning electrode 112 and the variable capacitor 128. A system controller 134 controls the functions of the various components, such as the RF power source 126, the drive system 103, and the variable capacitor 128. The system controller 134 executes system control software stored in a memory 138.

Thus, an RF path is established between the powered gas distribution manifold 118 and the tuning electrode 112 via plasma. Further, by changing the capacitance of the variable capacitor 128, the impedance for the RF path through the tuning electrode 112 changes, in turn, causing a change in the RF field coupled to the tuning electrode 112. Therefore, the plasma in the process volume 106 may be modulated across the surface of the substrate 110 during plasma processing.

Figure 2:
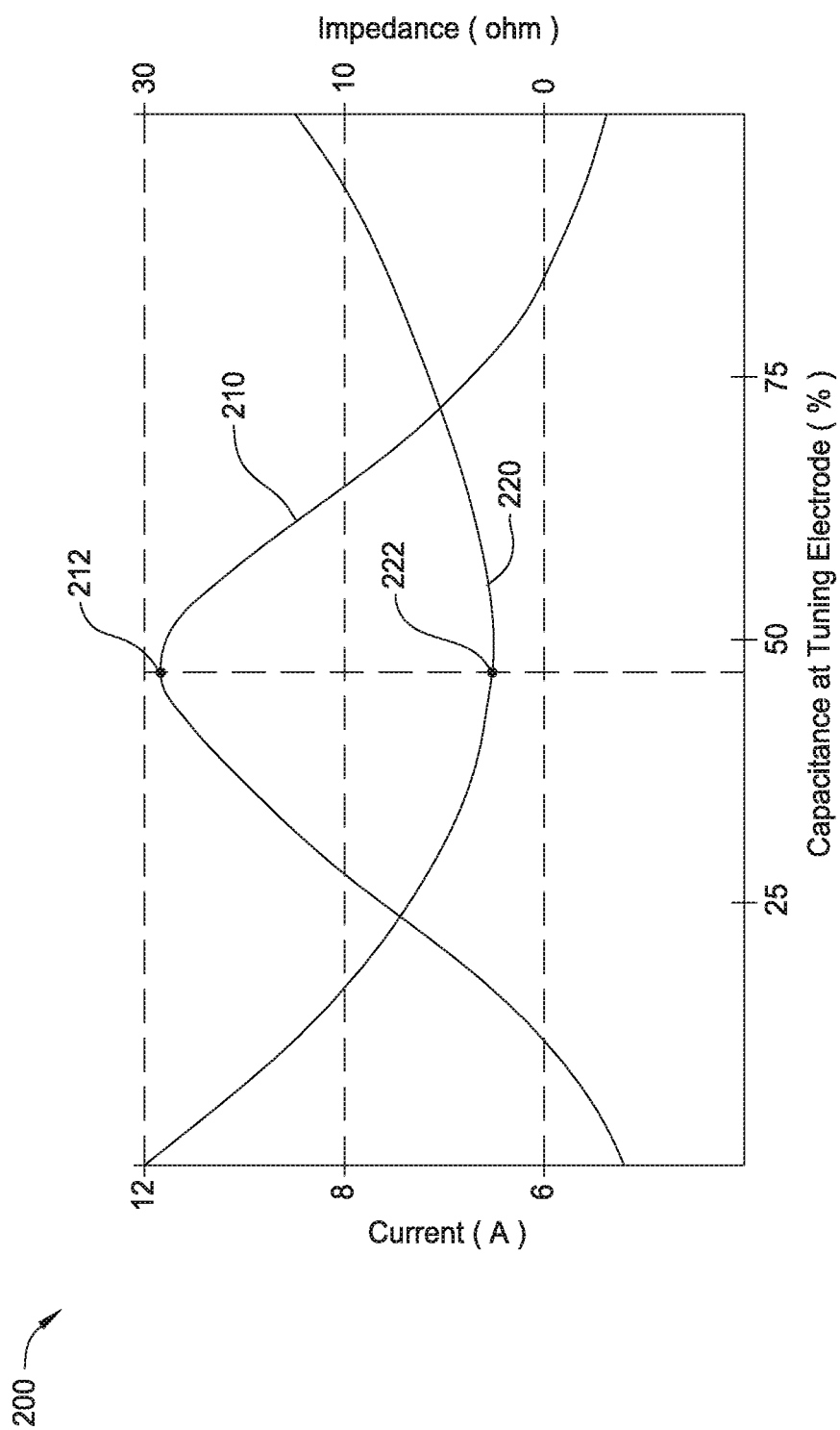
FIG. 2 is an exemplary depiction of the total current and the total impedance of the tuning electrode of FIG. 1, plotted as a function of the percentage of capacitance of the total capacitance at the variable capacitor.

FIG. 2 is an exemplary depiction of the total current 210 and the total impedance 220, of the tuning electrode 112 of FIG. 1, plotted as a function of the percentage of capacitance of the total capacitance at the variable capacitor 128. As can be seen in this example, the maximum current 212 and corresponding minimum impedance 222 of the tuning electrode 112 (i.e., resonance) is achieved at between about 40% and 50% of the total capacitance of the variable capacitor 128. This is due to the resonance of a series LC circuit formed by the inductive RF rod 122, the inductor L1, and the capacitor 128. By tuning the capacitor 128 to the resonance, the inductive impedance of the RF rod 122 can be canceled, and the overall impedance for this RF return path (i.e., from the top surface of the pedestal 108, through the tuning electrode 112, and through the RF rod 122) is minimized, resulting in the maximum possible current flowing through the tuning electrode 112, and thereby enhancing deposition rate. At lower and higher percentages of the total capacitance of the variable capacitor 128, the total current 210 decreases, while the corresponding total impedance 220 increases. Accordingly, a desired current and total impedance of the tuning electrode 112 can be modulated by controlling the total capacitance at the variable capacitor 128.

Figure 3A:
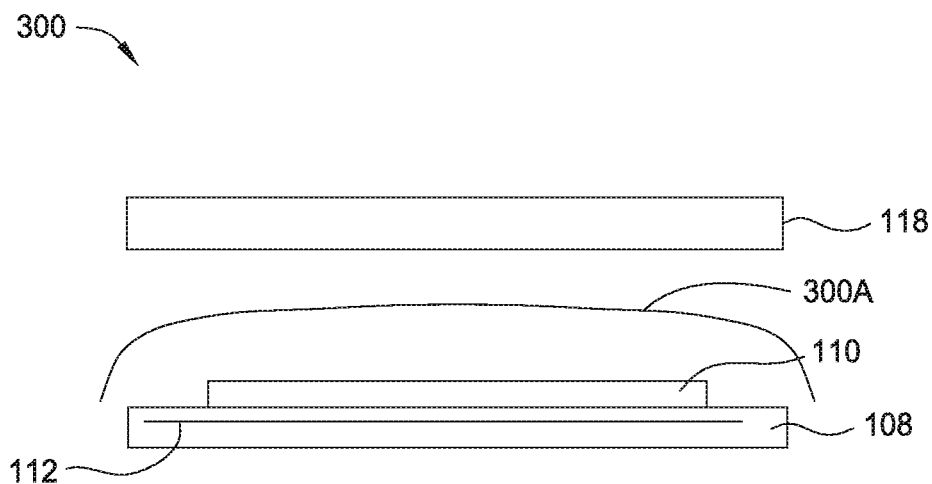
FIGS. 3A-3C are exemplary depictions of the electric field magnitude distribution across the substrate and the pedestal according to varying capacitances applied to the tuning electrode in the chamber of FIG. 1.
Figure 3B:
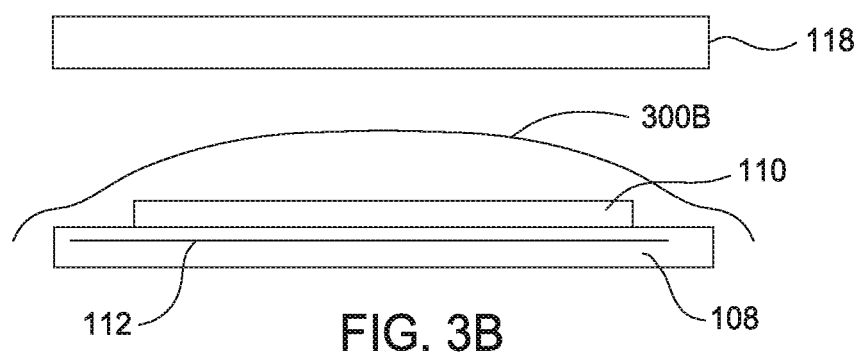
Figure 3C:
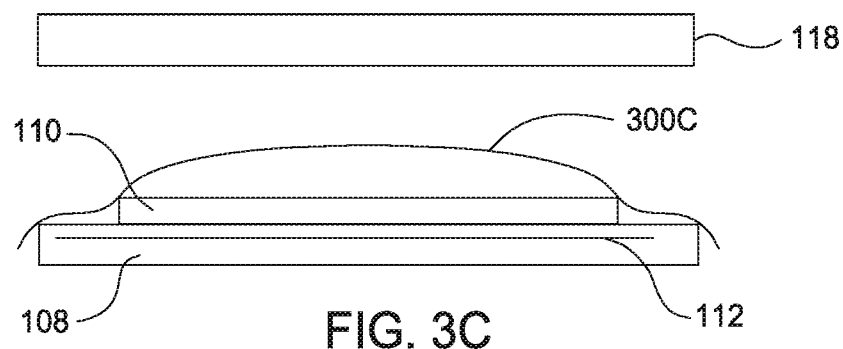

FIGS. 3A-3C are exemplary depictions of the electric field magnitude distribution across the substrate 110 and the pedestal 108 according to varying capacitances applied to the tuning electrode 112 in the chamber 100 of FIG. 1. FIG. 3A depicts the electric field distribution 300A across the substrate 110 and the pedestal 108 with a capacitance of between about 50 pF and about 200 pF (i.e., high impedance) at the variable capacitor 128 coupled to the tuning electrode 112. As can be seen from this example, the electric field is fairly flat across the substrate 110 and the surface of the pedestal 108. This is because, at a high impedance (on capacitive side), the impedance of the substrate 110 has relatively little effect on the total impedance across the tuning electrode 112.

FIG. 3B depicts the electric field distribution 300B across the substrate 110 and the pedestal 108 with a capacitance between about 1000 pF and about 2500 pF at the variable capacitor 128 coupled to the tuning electrode 112. As can be seen from this example, the electric field is lowered at the edge of the substrate 110 and the edge of the pedestal 108 as compared to the example in FIG. 3A because the capacitance is increased and the impedance to the tuning electrode 112 (still on capacitive side) is lowered, and the relative impact of the substrate 110 on the total impedance across the tuning electrode 112 is increased.

FIG. 3C depicts the electric field distribution 300C across the substrate 110 and the pedestal 108 with a capacitance between about 50 nF and about 150 nF (i.e., low impedance) at the variable capacitor 128 coupled to the tuning electrode 112. As can be seen from this example, the electric field is significantly lower at the edge of the substrate 110 and the edge of the pedestal 108 as compared to the examples in FIGS. 3A-3B. This is because at very low impedance in the pedestal 108 due to the tuning electrode 112, the impedance of the substrate 110 has a significantly greater effect on the total impedance than when the tuning electrode has a significantly higher impedance.

From the examples shown in FIGS. 3A-3C, it is clear that varying the capacitance in the variable capacitor 128 electrically coupled to the tuning electrode 112 results in a corresponding variation in the electric field across the surface of the substrate 110 and the pedestal 108. In particular, increasing the capacitance in the variable capacitor 128, and the corresponding decrease in the impedance through the tuning electrode 112, results in a decreased magnitude of the electric field at the edge of the substrate 110 and the edge of the pedestal 108 due to the RF coupling between the gas distribution manifold 118 and the tuning electrode 112 and the effect of the impedance of the substrate 110 relative to the overall impedance of the tuning electrode 112. Further, since the electric field is the power driver for generating the plasma in the chamber 100, it follows that increasing the magnitude of the electric field at the edge of the substrate 110 also increases the plasma density at the edge of the substrate 110. As a result, not only is the electric field across the surface of the substrate 110 being processed varied, but the plasma profile across the surface of the substrate 110 is correspondingly varied by varying the capacitance in the variable capacitor 128 electrically coupled to the tuning electrode 112. Correspondingly, the resulting film thickness profile deposited on the substrate 110 correlates with the plasma profile, resulting in the capability of varying the deposition film thickness profile by varying the capacitance in the variable capacitor 128 electrically coupled to the tuning electrode 112.

Figure 4A:
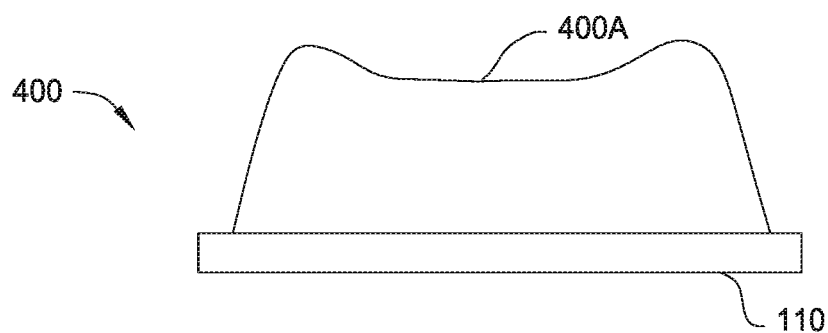
FIGS. 4A-4D are exemplary depictions of the resulting film thickness distribution across the substrate, processed in the chamber in FIG. 1, using varying capacitances applied to the tuning electrode during plasma deposition processing.

FIGS. 4A-4D are exemplary depictions of the resulting film thickness distribution across the substrate 110, processed in the chamber 100, using varying capacitances applied to the tuning electrode 112 during plasma deposition processing. FIG. 4A depicts the film thickness distribution across the substrate 110 with the variable capacitor 128 set at 22% of its maximum capacitance. As can be seen from this example, the film thickness 400A is high near the edge of the substrate 110 as compared to the film thickness at the center of the substrate 110, and then abruptly drops to the minimum level before reaching the very edge.

Figure 4B:
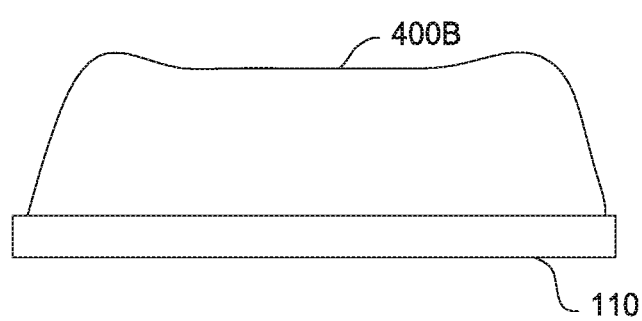

FIG. 4B depicts the film thickness distribution across the substrate 110 with the variable capacitor 128 set at 28% of its maximum capacitance. As can be seen from this example, by increasing the capacitance in the variable capacitor 128 (i.e., decreasing impedance), the film thickness 400B is lowered at the edge of the substrate 110 with respect to the film thickness at the center of the substrate 110 as compared to the example in FIG. 4A, and then stretched out towards the edge of the substrate 110.

Figure 4C:
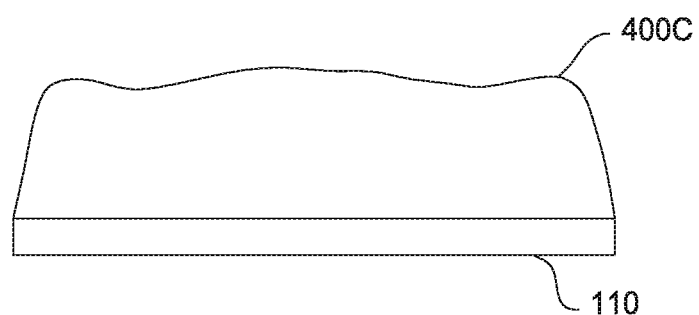

FIG. 4C depicts the film thickness distribution across the substrate 110 with the variable capacitor 128 set at 32% of its maximum capacitance. As can be seen from this example, by further increasing the capacitance in the variable capacitor 128, the film thickness 400C is further lowered at the edge of the substrate 110 with respect to the film thickness at the center of the substrate 110 as compared to the example in FIG. 4B, and further stretched out towards the edge of the substrate 110. As a result, the film thickness 400C is relatively uniform across the surface of the substrate 110.

Figure 4D:
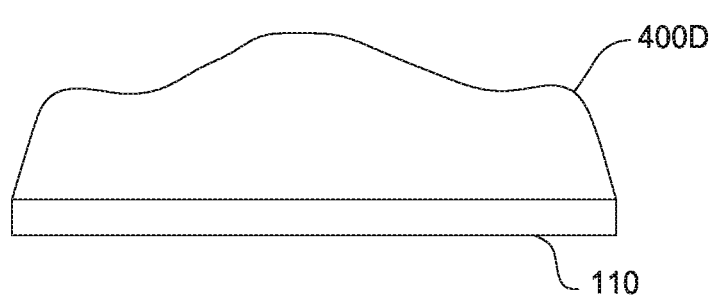

FIG. 4D depicts the film thickness distribution across the substrate 110 with the variable capacitor 128 set at 36% of its maximum capacitance. As can be seen from this example, by further increasing the capacitance in the variable capacitor 128, the film thickness 400C is substantially lowered at the edge of the substrate 110 with respect to the film thickness at the center of the substrate 110 as compared to the example in FIG. 4C. As a result, the profile of the film thickness 400D is flipped over to the edge-low, center-high profile from the edge-high, center-low profile of the film thickness 400A shown in FIG. 4A.

From the examples shown in FIGS. 4A-4D, it is clear that varying the capacitance in the variable capacitor 128 electrically coupled to the tuning electrode 112 results in a corresponding variation in the deposited film thickness across the surface of the substrate 110. In particular, increasing the capacitance in the variable capacitor 128, and correspondingly decreasing the impedance at the tuning electrode 112 and decreasing the electric field magnitude at the edge of the substrate 110 with respect to the center as shown in FIGS. 3A-3C, results in a decrease in the corresponding edge film thickness with respect to the center film thickness of the substrate 110. Thus, the varying the capacitance in the variable capacitor 128 coupled to the tuning electrode 112 allows for control of the film thickness profile (center to edge) across the surface of the substrate 110 being processed.

While the foregoing is directed to embodiments of the present invention, other and further embodiments of the invention may be devised without departing from the basic scope thereof, and the scope thereof is determined by the claims that follow.

The invention claimed is:

1. A method for processing a substrate within a processing apparatus, comprising:
    powering a gas distribution manifold using an RF source while flowing one or more process gases into a chamber to form a plasma within a process volume of the chamber, the chamber having the substrate disposed on a substrate support pedestal therein;
    receiving, from a sensor having a first terminal and a second terminal, a signal to adjust a capacitance of a tuning electrode, the tuning electrode disposed within the substrate support pedestal and electrically coupled to the first terminal of the sensor; and
    controlling the plasma, based on the signal, by varying the capacitance of a variable capacitor having a first capacitor terminal electrically coupled to the second terminal of the sensor, wherein the processing apparatus further comprises:
        a first inductor having a first L1 terminal electrically coupled to a second terminal of the variable capacitor and a second L1 terminal for electrical grounding; and
        a second inductor having a first L2 terminal electrically coupled to the second terminal of the sensor and a second L2 terminal for electrical grounding, and wherein the second inductor is connected in parallel to the first inductor and the variable capacitor.

2. The method of claim 1, further comprising controlling an impedance between the tuning electrode and ground by varying the capacitance of the variable capacitor electrically coupled to the tuning electrode.

3. The method of claim 2, wherein the controlling the impedance between the tuning electrode and ground comprises tuning the impedance to a minimum value.

4. The method of claim 1, further comprising controlling a current to the tuning electrode by varying the capacitance of the variable capacitor.

5. The method of claim 4, wherein controlling the current to the tuning electrode comprises tuning the current to a maximum value.

6. The method of claim 1, further comprising decreasing the plasma density at an edge of the substrate by increasing the capacitance of the variable capacitor.

7. The method of claim 1, further comprising controlling an impedance of an RF path between the gas distribution manifold and the variable capacitor.

8. A method for processing a substrate within a processing apparatus, comprising:
    powering a gas distribution manifold using an RF source while flowing one or more process gases into a chamber to form a plasma within a process volume of the chamber, the chamber having the substrate disposed on a substrate support pedestal therein;
    receiving, from a sensor coupled to a tuning electrode, a signal to adjust a capacitance of the tuning electrode; and
    varying, based on the signal, the capacitance of a variable capacitor coupled to the tuning electrode at a first terminal of the variable capacitor, the capacitance of the variable capacitor controlling the current to the tuning electrode, wherein the processing apparatus further comprises:
        a first inductor having a first L1 terminal electrically coupled to a second terminal of the variable capacitor and a second L1 terminal for electrical grounding; and
        a second inductor having a first L2 terminal electrically coupled to the tuning electrode and a second L2 terminal for electrical grounding, and wherein the second inductor is connected in parallel to the first inductor and the variable capacitor.

9. The method of claim 8, further comprising controlling an impedance between the tuning electrode and ground by varying the capacitance of the variable capacitor.

10. The method of claim 9, wherein the controlling the impedance between the tuning electrode and ground comprises tuning the impedance to a minimum value.

11. The method of claim 8, further comprising decreasing a magnitude of an electric field at an edge of a substrate by increasing the capacitance of the variable capacitor.

12. The method of claim 11, further comprising decreasing the plasma density at the edge of the substrate by increasing the capacitance of the variable capacitor.

13. The method of claim 8, wherein controlling a current to the tuning electrode comprises tuning the current to a maximum value.

14. The method of claim 8, further comprising controlling an impedance of an RF path between the gas distribution manifold and the tuning electrode.

\* \* \* \* \*